(12) United States Patent
Zhang

(10) Patent No.: US 9,876,040 B1
(45) Date of Patent: Jan. 23, 2018

(54) METHOD FOR MANUFACTURING TFT SUBSTRATE

(71) Applicant: Shenzhen China Star Optoelectronics Technology Co., Ltd., Shenzhen (CN)

(72) Inventor: Xiaoxing Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 231 days.

(21) Appl. No.: 14/912,927

(22) PCT Filed: Jan. 29, 2016

(86) PCT No.: PCT/CN2016/072864
§ 371 (c)(1),
(2) Date: Feb. 19, 2016

(87) PCT Pub. No.: WO2017/092172
PCT Pub. Date: Jun. 8, 2017

(30) Foreign Application Priority Data

Dec. 3, 2015 (CN) .......................... 2015 1 0883687

(51) Int. Cl.
*H01L 27/32* (2006.01)
*H01L 29/786* (2006.01)
(Continued)

(52) U.S. Cl.
CPC ...... *H01L 27/1277* (2013.01); *H01L 27/1274* (2013.01); *H01L 27/1288* (2013.01);
(Continued)

(58) Field of Classification Search
CPC ............. H01L 27/1274; H01L 27/1277; H01L 27/1288
See application file for complete search history.

(56) References Cited

U.S. PATENT DOCUMENTS

2007/0252207 A1* 11/2007 Park .................. H01L 27/12 257/347
2008/0135849 A1* 6/2008 Yamayoshi ....... H01L 29/41733 257/66

(Continued)

*Primary Examiner* — Zandra Smith
*Assistant Examiner* — Molly Reida
(74) *Attorney, Agent, or Firm* — Leong C. Lei

(57) ABSTRACT

The present invention provides a method for manufacturing a TFT substrate, in which after induced crystallization is conducted by implanting ions into an amorphous silicon layer, there is no need to completely remove the ion induction layer formed on the surface of a poly-silicon layer so obtained and instead, a half-tone mask based operation is applied to remove only a portion of the ion induction layer corresponding to a channel zone and there is no need for re-conducting ion implantation subsequently for source/drain contact zones, thereby saving the mask necessary for re-conducting ion implantation. Further, the source/drain electrodes are also formed with the half-tone mask based operation so as to save the mask necessary for making the source/drain electrodes. Further, the source/drain electrodes are formed first so that the formation of an interlayer insulation layer can be omitted thereby saving the mask necessary for forming the interlayer insulation layer. Through the adoption of a half-tone mask base operation, the method for manufacturing a TFT substrate according to the present invention can reduce the nine masks that are involved in the prior art techniques to only six masks, thereby effectively simplifying the manufacturing process, improving manufacturing efficiency, and saving manufacturing cost.

15 Claims, 7 Drawing Sheets

(51) Int. Cl.
*H01L 27/12* (2006.01)
*H01L 29/66* (2006.01)

(52) U.S. Cl.
CPC ...... *H01L 27/3246* (2013.01); *H01L 27/3248* (2013.01); *H01L 27/3258* (2013.01); *H01L 29/66757* (2013.01)

(56) References Cited

U.S. PATENT DOCUMENTS

2009/0096024 A1* 4/2009 Shingu ................ H01L 29/458
257/347
2016/0133679 A1* 5/2016 Jeon .................. H01L 27/1255
257/40

* cited by examiner

METHOD FOR MANUFACTURING TFT SUBSTRATE

BACKGROUND OF THE INVENTION

1. Field of the Invention

The present invention relates to the field of display technology, and in particular to a method for manufacturing a thin-film transistor (TFT) substrate.

2. The Related Arts

Thin-film transistors (TFTs) are the primary driving components involved in liquid crystal displays (LCDs) and active matrix organic light-emitting diode (AMOLED) displays that are currently available and are directly related to the development of high performance flat panel displays devices.

Low temperature poly-silicon (LTPS) techniques are manufacturing techniques of new generation TFT substrate and compared to the traditional amorphous silicon (a-Si) technology, the primary difference resides in that LTPS has a faster response speed and exhibits advantages, such as high brightness, high resolution, and low power consumption.

The processes for crystallization of LTPS that are currently known include excimer laser anneal (ELA) techniques and solid phase crystallization (SPC) techniques. Among them, SPC techniques are good for easy size enlargement and thus possess higher cost advantages, making them the focus of study and research. The conventional SPC techniques include extended-period direct high temperature heating and baking and ion induction. Ion-induced crystallization includes processes of crystallization involving induction ions of nickel (Ni) or boron (B).

In the induction SPC process, after crystallization is induced through implantation of ions, in order to form a semiconductor layer, the amorphous silicon that was implanted with induction ions must be removed to form an active layer of semiconductor. However, in the subsequent operation of forming contact zones for source/drain electrodes, it also needs to implant boron ions or phosphorous ions to achieve better effect of contact.

Referring to FIGS. 1-8, a conventional method for manufacturing a TFT substrate generally comprises the following steps:

Step 1: as shown in FIG. 1, providing a base plate 100; depositing a buffer layer 200 on the base plate 100; and depositing an amorphous silicon layer 300 on the buffer layer 200.

Step 2: as shown in FIG. 2, subjecting the amorphous silicon layer 300 to ion implantation and conducting high temperature baking to have the amorphous silicon converted into poly-silicon to form a poly-silicon layer 400 located on the buffer layer 200 and an ion induction layer 500 located on the poly-silicon layer 400.

Step 3: as shown in FIG. 3, applying an etching operation to remove the ion induction layer 500 so as to obtain the poly-silicon layer 400.

Step 4: as shown in FIG. 4, subjecting the poly-silicon layer 400 to patterning to obtain an island-like semiconductor layer 410.

Step 5: as shown in FIG. 5, coating photoresist on the island-like semiconductor layer 410 and the buffer layer 200, followed by exposure and development to obtain a photoresist layer 500.

Step 6: as shown in FIG. 6, using the photoresist layer 500 as a shielding layer to subject the island-like semiconductor layer 410 to boron ion implantation so as to form source/drain contact zones 600 in the island-like semiconductor layer 410.

Step 7: as shown in FIG. 7, peeling off the photoresist layer 500 and depositing a gate insulation layer 700 on the island-like semiconductor layer 410 and the buffer layer 200; forming a gate electrode 800 on the gate insulation layer 700.

Step 8: as shown in FIG. 8, forming an interlayer insulation layer 900, source/drain electrodes 910, a planarization layer 920, a cathode 930, and a pixel definition layer 940 on the gate insulation layer 700 and the gate electrode 800, and finally conducting vapor deposition of an organic light-emitting diode (OLED) 950 to complete the entire manufacturing process of a TFT substrate, which requires nine runs of mask definition before the vapor deposition of the OLED so that the manufacturing cost is relatively high.

Thus, it is desired to provide a method for manufacturing a TFT substrate that helps overcome the above problems.

SUMMARY OF THE INVENTION

An object of the present invention is to provide a method for manufacturing a thin-film transistor (TFT) substrate, which effectively simplifies the manufacturing process, increases the manufacturing efficiency, and saves manufacturing cost.

To achieve the above object, the present invention provides a method for manufacturing a TFT substrate, which comprises the following steps:

(1) providing a base plate, depositing a buffer layer on the base plate, and depositing an amorphous silicon layer on the buffer layer;

(2) subjecting the amorphous silicon layer to ion implantation and conducting high temperature baking to have the amorphous silicon crystallized and converted into poly-silicon to form a poly-silicon layer located on the buffer layer and an ion induction layer located on the poly-silicon layer;

(3) depositing a first metal layer on the ion induction layer, coating photoresist on the first metal layer, providing a half-tone mask and using the half-tone mask to subject the photoresist to exposure and development to form a first photoresist segment and a second photoresist segment that are spaced from each other, wherein the first photoresist segment has two side areas having a thickness that is greater than a thickness of a central area;

(4) using the first photoresist segment and the second photoresist segment as a shielding layer to subject the first metal layer, the ion induction layer, the poly-silicon layer to etching so as to form an island-like semiconductor and source/drain area;

(5) subjecting the first photoresist segment and the second photoresist segment to ashing to remove the central area of the first photoresist segment, using a remaining portion of the first photoresist segment as a shielding layer to subject the first metal layer and the ion induction layer contained in the island-like semiconductor and source/drain area to etching to obtain an island-like semiconductor layer having a channel zone, source/drain contact zones located on the island-like semiconductor layer, and source/drain electrodes located on the source/drain contact zones; and peeling off remaining portions of the first photoresist segment and the second photoresist segment;

(6) depositing a gate insulation layer on the source/drain electrodes; depositing a second metal layer on the gate insulation layer and subjecting the second metal layer to patterning to form a gate electrode;

(7) forming a protection layer on the gate insulation layer and the gate electrode; forming a planarization layer on the protection layer; forming a via in the planarization layer, the protection layer, and the gate insulation layer to correspond to the source/drain electrodes; and (8) forming a cathode on the planarization layer such that the cathode is connected through the via to the source/drain electrodes; forming a pixel definition layer on the planarization layer and forming an opening in the pixel definition layer to expose a portion of the cathode; conducting vapor depositing of an organic light-emitting diode (OLED) in the opening.

In step (1), the base plate comprises a glass plate.

In step (1), the buffer layer comprises a silicon nitride layer, a silicon oxide layer, or a combination thereof; the buffer layer has a thickness of 2000-4000 Å.

In step (1), the amorphous silicon layer has a thickness of 2000-4000 Å.

In step (2), ions implanted into the amorphous silicon layer comprise boron ions or nickel ions.

In step (3), the first metal layer comprises one of molybdenum, aluminum, and copper, or a stacked combination of multiple ones thereof; the first metal layer has a thickness of 2000-4000 Å.

In step (6), the gate insulation layer comprises a silicon nitride layer, a silicon oxide layer, or a combination thereof; the gate insulation layer has a thickness of 2000-4000 Å.

In step (6), the second metal layer comprises one of molybdenum, aluminum, and copper, or a stacked combination of multiple ones thereof; the second metal layer has a thickness of 2000-4000 Å.

In step (7), the protection layer comprises a silicon nitride layer, a silicon oxide layer, or a combination thereof; the protection layer has a thickness of 2000-4000 Å.

In step (8), the cathode comprises a composition structure of indium tin oxide/silver/indium tin oxide or a single layer of metallic silver; the cathode has a thickness of 1000-3000 Å.

The present invention also provides a method for manufacturing a TFT substrate, which comprises the following steps:

(1) providing a base plate, depositing a buffer layer on the base plate, and depositing an amorphous silicon layer on the buffer layer;

(2) subjecting the amorphous silicon layer to ion implantation and conducting high temperature baking to have the amorphous silicon crystallized and converted into poly-silicon to form a poly-silicon layer located on the buffer layer and an ion induction layer located on the poly-silicon layer;

(3) depositing a first metal layer on the ion induction layer, coating photoresist on the first metal layer, providing a half-tone mask and using the half-tone mask to subject the photoresist to exposure and development to form a first photoresist segment and a second photoresist segment that are spaced from each other, wherein the first photoresist segment has two side areas having a thickness that is greater than a thickness of a central area;

(4) using the first photoresist segment and the second photoresist segment as a shielding layer to subject the first metal layer, the ion induction layer, the poly-silicon layer to etching so as to form an island-like semiconductor and source/drain area;

(5) subjecting the first photoresist segment and the second photoresist segment to ashing to remove the central area of the first photoresist segment, using a remaining portion of the first photoresist segment as a shielding layer to subject the first metal layer and the ion induction layer contained in the island-like semiconductor and source/drain area to etching to obtain an island-like semiconductor layer having a channel zone, source/drain contact zones located on the island-like semiconductor layer, and source/drain electrodes located on the source/drain contact zones; and peeling off remaining portions of the first photoresist segment and the second photoresist segment;

(6) depositing a gate insulation layer on the source/drain electrodes; depositing a second metal layer on the gate insulation layer and subjecting the second metal layer to patterning to form a gate electrode;

(7) forming a protection layer on the gate insulation layer and the gate electrode; forming a planarization layer on the protection layer; forming a via in the planarization layer, the protection layer, and the gate insulation layer to correspond to the source/drain electrodes; and (8) forming a cathode on the planarization layer such that the cathode is connected through the via to the source/drain electrodes; forming a pixel definition layer on the planarization layer and forming an opening in the pixel definition layer to expose a portion of the cathode; conducting vapor depositing of an OLED in the opening;

wherein in step (1), the base plate comprises a glass plate;

wherein in step (1), the buffer layer comprises a silicon nitride layer, a silicon oxide layer, or a combination thereof; the buffer layer has a thickness of 2000-4000 Å;

wherein in step (1), the amorphous silicon layer has a thickness of 2000-4000 Å;

wherein in step (2), ions implanted into the amorphous silicon layer comprise boron ions or nickel ions; and wherein in step (3), the first metal layer comprises one of molybdenum, aluminum, and copper, or a stacked combination of multiple ones thereof; the first metal layer has a thickness of 2000-4000 Å.

The efficacy of the present invention is that the present invention provides a method for manufacturing a TFT substrate, in which after induced crystallization is conducted by implanting ions into an amorphous silicon layer, there is no need to completely remove the ion induction layer formed on the surface of a poly-silicon layer so obtained and instead, a half-tone mask based operation is applied to remove only a portion of the ion induction layer corresponding to a channel zone and there is no need for re-conducting ion implantation subsequently for source/drain contact zones, thereby saving the mask necessary for re-conducting ion implantation. Further, the source/drain electrodes are also formed with the half-tone mask based operation so as to save the mask necessary for making the source/drain electrodes. Further, the source/drain electrodes are formed first so that the formation of an interlayer insulation layer can be omitted thereby saving the mask necessary for forming the interlayer insulation layer. Through the adoption of a half-tone mask base operation, the method for manufacturing a TFT substrate according to the present invention can reduce the nine masks that are involved in the prior art techniques to only six masks, thereby effectively simplifying the manufacturing process, improving manufacturing efficiency, and saving manufacturing cost.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
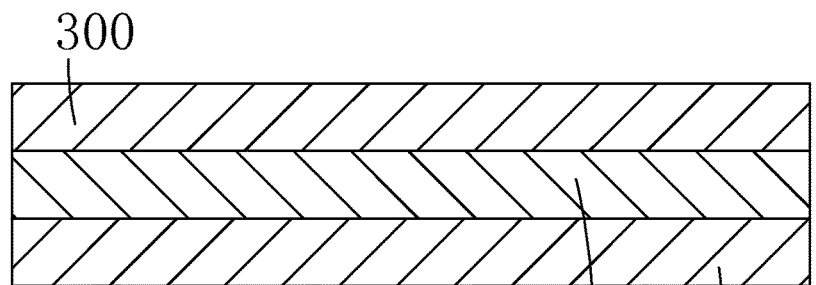
FIG. 1 is a schematic view illustrating step 1 of a conventional method for manufacturing a thin-film transistor (TFT) substrate.
Figure 2:
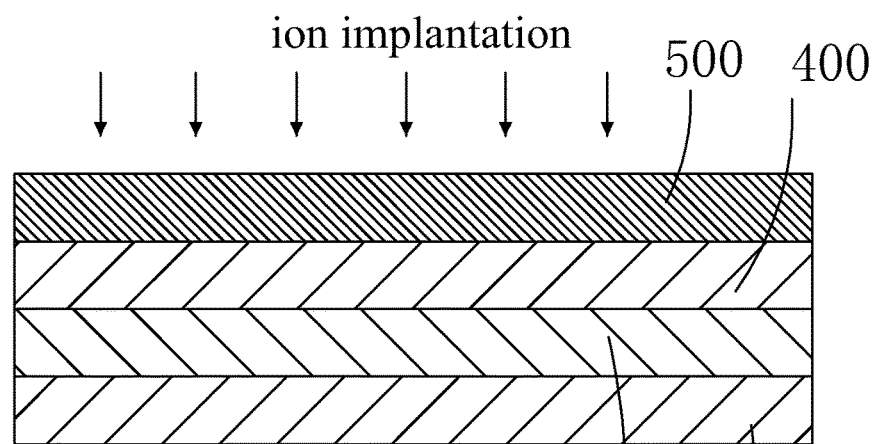
FIG. 2 is a schematic view illustrating step 2 of the conventional method for manufacturing a TFT substrate.
Figure 3:
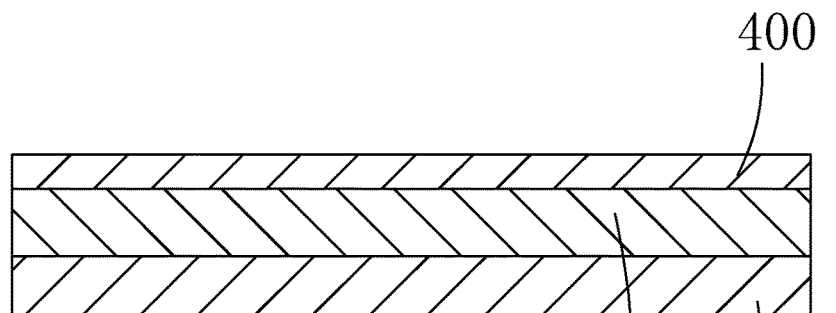
FIG. 3 is a schematic view illustrating step 3 of the conventional method for manufacturing a TFT substrate.
Figure 4:
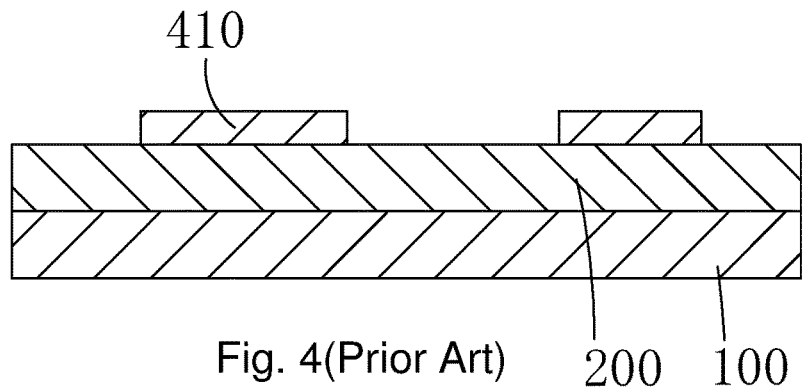
FIG. 4 is a schematic view illustrating step 4 of the conventional method for manufacturing a TFT substrate.
Figure 5:
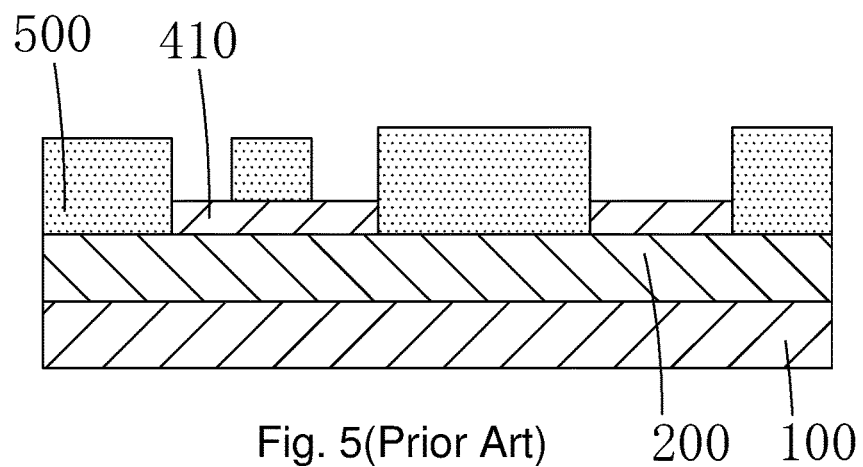
FIG. 5 is a schematic view illustrating step 5 of the conventional method for manufacturing a TFT substrate.
Figure 6:
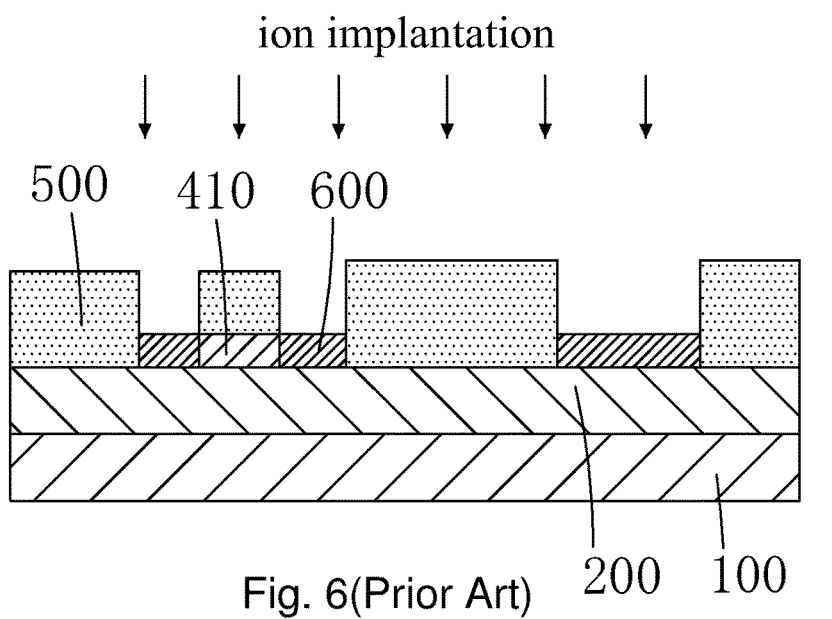
FIG. 6 is a schematic view illustrating step 6 of the conventional method for manufacturing a TFT substrate.
Figure 7:
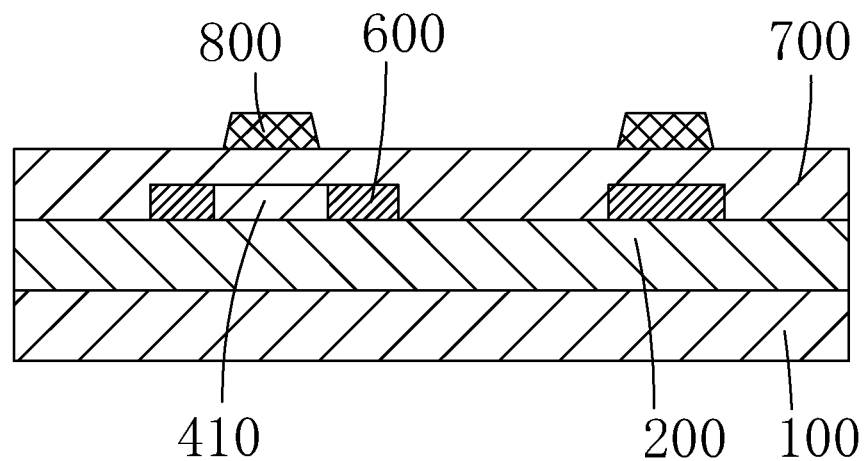
FIG. 7 is a schematic view illustrating step 7 of the conventional method for manufacturing a TFT substrate.
Figure 8:
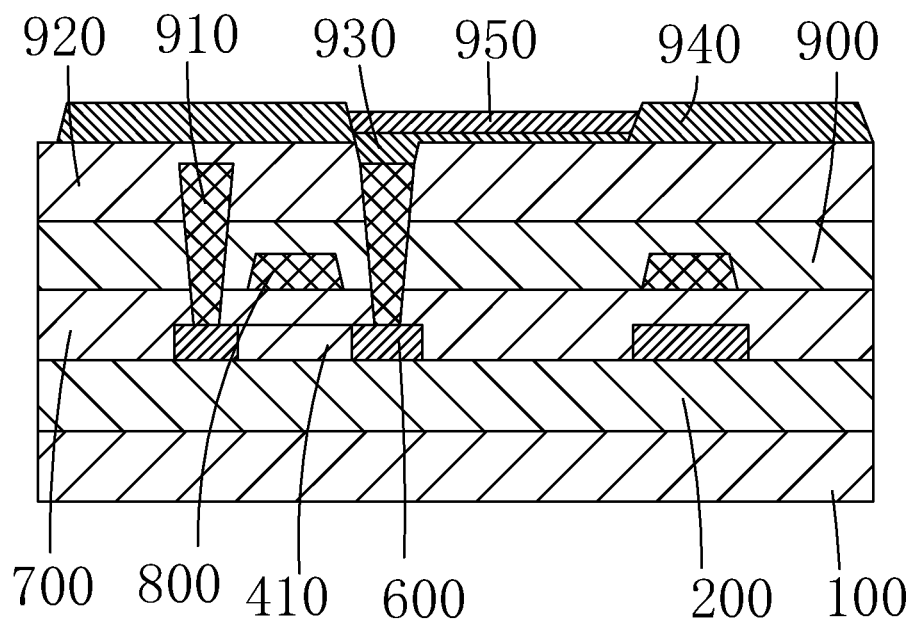
FIG. 8 is a schematic view illustrating step 8 of the conventional method for manufacturing a TFT substrate.
Figure 9:
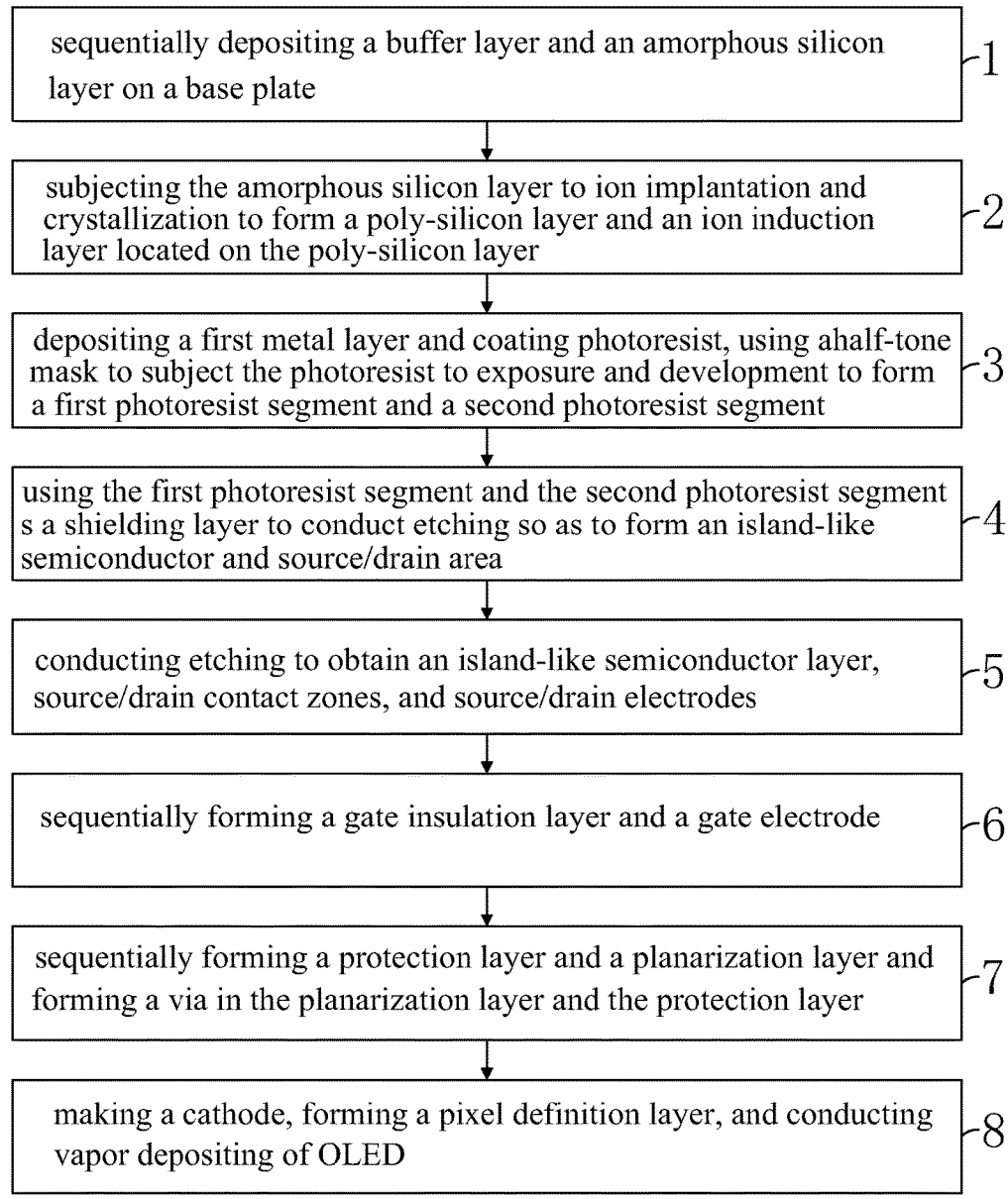
FIG. 9 is a flow chart illustrating a method for manufacturing a TFT substrate according to the present invention.
Figure 10:
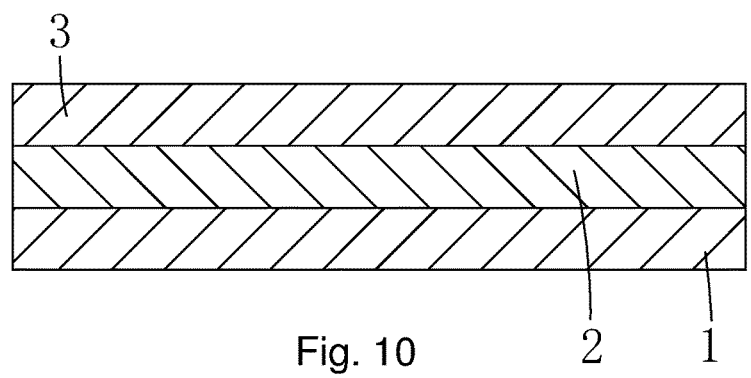
FIG. 10 is a schematic view illustrating step 1 of the method for manufacturing a TFT substrate according to the present invention.

Referring to FIG. 9, the present invention provides a method for manufacturing a TFT substrate, which comprises the following steps:

Step 1: as shown in FIG. 10, providing a base plate 1, depositing a buffer layer 2 on the base plate 1, and depositing an amorphous silicon layer 3 on the buffer layer 2.

Specifically, the base plate 1 comprises a glass plate.

Specifically, the buffer layer 2 comprises a silicon nitride (SiNx) layer, a silicon oxide (SiOx) layer, or a composite layer thereof; the buffer layer 2 has a thickness of 2000-4000 Å.

Specifically, the amorphous silicon layer 3 has a thickness of 2000-4000 Å.

Figure 11:
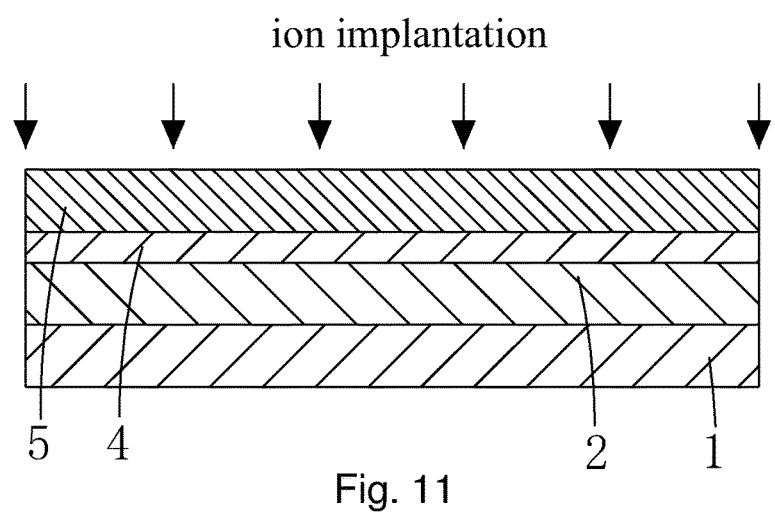
FIG. 11 is a schematic view illustrating step 2 of the method for manufacturing a TFT substrate according to the present invention.

Step 2: as shown in FIG. 11, subjecting the amorphous silicon layer 3 to ion implantation and conducting high temperature baking to have the amorphous silicon crystallized and converted into poly-silicon to form a poly-silicon layer 4 located on the buffer layer 2 and an ion induction layer 5 located on the poly-silicon layer 4. The ion induction layer 5 may be in direction contact with source/drain electrodes.

Specifically, the ions implanted in the amorphous silicon layer 3 are boron ions or nickel ions.

Figure 12:
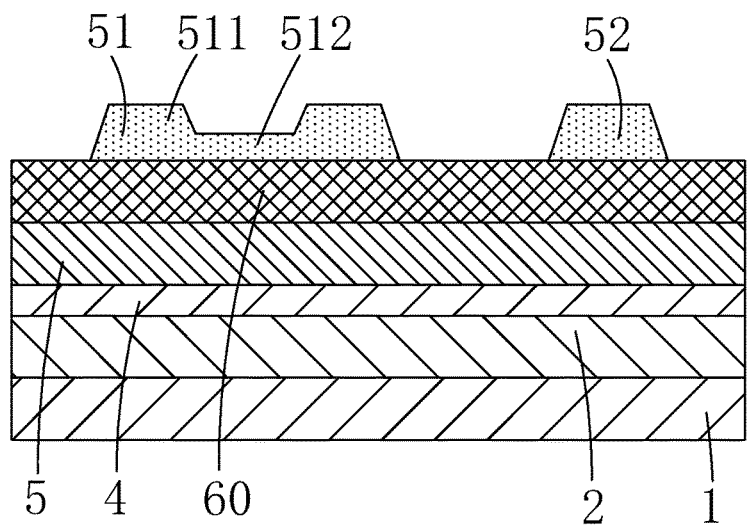
FIG. 12 is a schematic view illustrating step 3 of the method for manufacturing a TFT substrate according to the present invention.

Step 3: as shown in FIG. 12, depositing a first metal layer 60 on the ion induction layer 5, coating photoresist on the first metal layer 60, providing a half-tone mask and using the half-tone mask to subject the photoresist to exposure and development to form a first photoresist segment 51 and a second photoresist segment 52 that are spaced from each other, wherein the first photoresist segment 51 has two side areas 511 having a thickness that is greater than a thickness of a central area 512.

Specifically, the first metal layer 60 comprises one of molybdenum (Mo), aluminum (Al), and copper (Cu) or a stacked combination of multiple ones thereof; the first metal layer 60 has a thickness of 2000-4000 Å.

Figure 13:
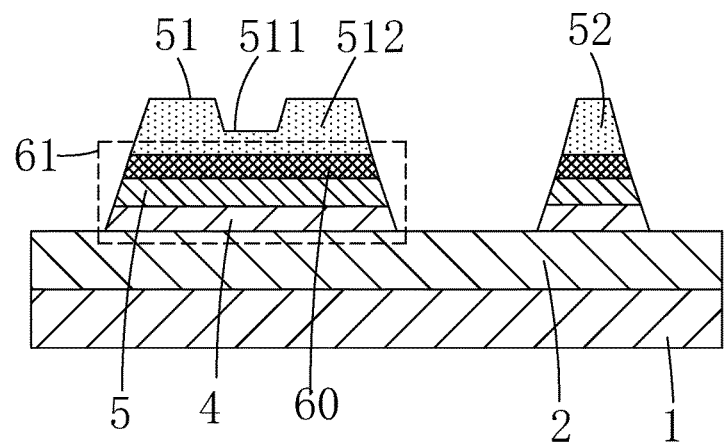
FIG. 13 is a schematic view illustrating step 4 of the method for manufacturing a TFT substrate according to the present invention.

Step 4: as shown in FIG. 13, using the first photoresist segment 51 and the second photoresist segment 52 as a shielding layer to subject the first metal layer 60, the ion induction layer 5, the poly-silicon layer 4 to etching so as to form an island-like semiconductor and source/drain area 61.

Figure 14:
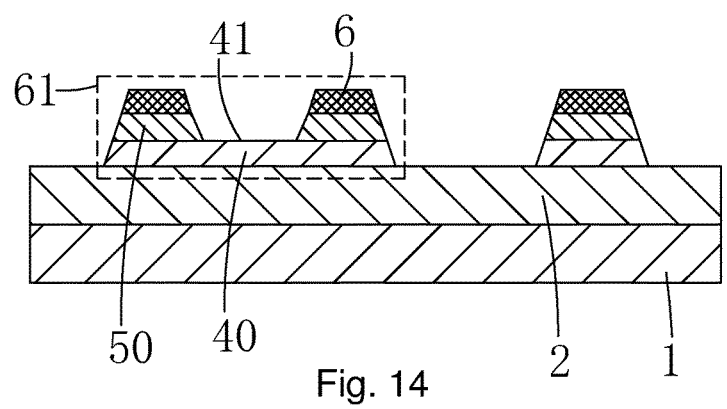
FIG. 14 is a schematic view illustrating step 5 of the method for manufacturing a TFT substrate according to the present invention.

Step 5: as shown in FIG. 14, subjecting the first photoresist segment 51 and the second photoresist segment 52 to ashing to remove the central area 512 of the first photoresist segment 51, using a remaining portion of the first photoresist segment 51 as a shielding layer to subject the first metal layer 60 and the ion induction layer 5 contained in the island-like semiconductor and source/drain area 61 to etching to obtain an island-like semiconductor layer 40 having a channel zone 41, source/drain contact zones 50 located on the island-like semiconductor layer 40, and source/drain electrodes 6 located on the source/drain contact zones 50; and peeling off remaining portions of the first photoresist segment 51 and the second photoresist segment 52.

Figure 15:
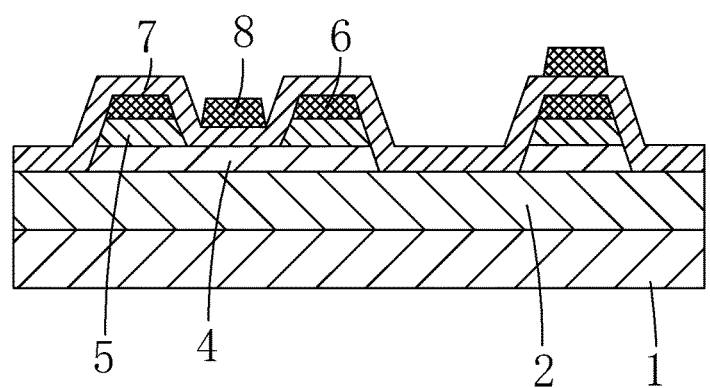
FIG. 15 is a schematic view illustrating step 6 of the method for manufacturing a TFT substrate according to the present invention.

Step 6: as shown in FIG. 15, depositing a gate insulation layer 7 on the source/drain electrodes 6; depositing a second metal layer on the gate insulation layer 7 and subjecting the second metal layer to patterning to form a gate electrode 8.

Specifically, the gate insulation layer 7 comprises a silicon nitride layer, a silicon oxide layer, or a combination thereof; the gate insulation layer 7 has a thickness of 2000-4000 Å.

Specifically, the second metal layer comprises one of molybdenum, aluminum, and copper, or a stacked combination of multiple ones thereof; the second metal layer has a thickness of 2000-4000 Å.

Figure 16:
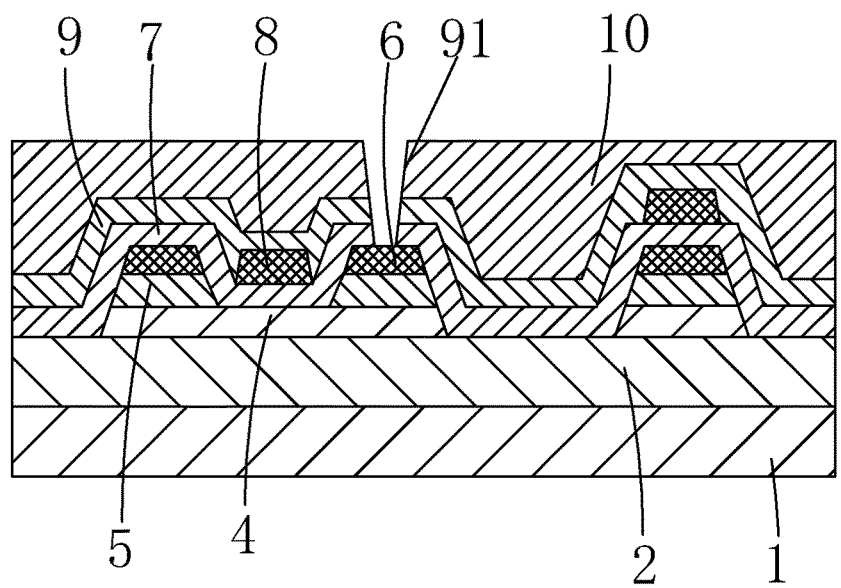
FIG. 16 is a schematic view illustrating step 7 of the method for manufacturing a TFT substrate according to the present invention.

Step 7: as shown in FIG. 16, forming a protection layer 9 on the gate insulation layer 7 and the gate electrode 8; forming a planarization layer 10 on the protection layer 9; forming a via 91 in the planarization layer 10, the protection layer 9, and the gate insulation layer 7 to correspond to the source/drain electrodes 6.

Specifically, the protection layer 9 comprises a silicon nitride layer, a silicon oxide layer, or a combination thereof; the protection layer 9 has a thickness of 2000-4000 Å.

Figure 17:
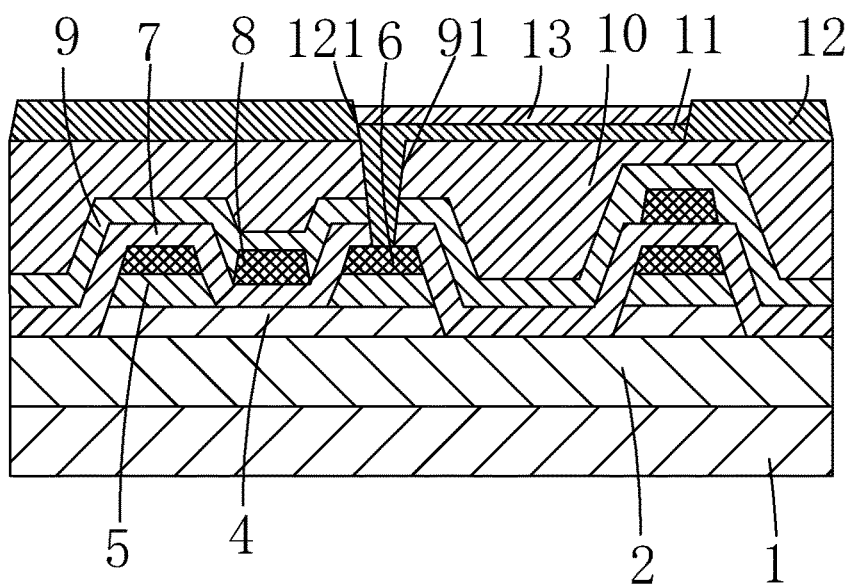
FIG. 17 is a schematic view illustrating step 8 of the method for manufacturing a TFT substrate according to the present invention.

Step 8: as shown in FIG. 17, forming a cathode 11 on the planarization layer 10 such that the cathode 11 is connected through the via 91 to the source/drain electrodes 6; forming a pixel definition layer 12 on the planarization layer 10 and forming an opening 121 in the pixel definition layer 12 to expose a portion of the cathode 11; conducting vapor depositing of an organic light-emitting diode (OLED) 13 in the opening 121.

Specifically, the cathode 11 comprises a composition structure of indium tin oxide (ITO)/silver (Ag)/indium tin oxide (ITO) or a single layer of metallic silver; the cathode 11 has a thickness of 1000-3000 Å.

In summary, the present invention provides a method for manufacturing a TFT substrate, in which after induced crystallization is conducted by implanting ions into an amorphous silicon layer, there is no need to completely remove the ion induction layer formed on the surface of a poly-silicon layer so obtained and instead, a half-tone mask based operation is applied to remove only a portion of the ion induction layer corresponding to a channel zone and there is no need for re-conducting ion implantation subsequently for source/drain contact zones, thereby saving the mask necessary for re-conducting ion implantation. Further, the source/drain electrodes are also formed with the half-tone mask based operation so as to save the mask necessary for making the source/drain electrodes. Further, the source/drain electrodes are formed first so that the formation of an interlayer insulation layer can be omitted thereby saving the mask necessary for forming the interlayer insulation layer. Through the adoption of a half-tone mask base operation, the method for manufacturing a TFT substrate according to the present invention can reduce the nine masks that are involved in the prior art techniques to only six masks, thereby effectively simplifying the manufacturing process, improving manufacturing efficiency, and saving manufacturing cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) substrate, comprising the following steps:
   (1) providing a base plate, depositing a buffer layer on the base plate, and depositing an amorphous silicon layer on the buffer layer;
   (2) subjecting the amorphous silicon layer to ion implantation and conducting high temperature baking to have the amorphous silicon crystallized and converted into poly-silicon to form a poly-silicon layer located on the buffer layer and an ion induction layer located on the poly-silicon layer;
   (3) depositing a first metal layer on the ion induction layer, coating photoresist on the first metal layer, providing a half-tone mask and using the half-tone mask to subject the photoresist to exposure and development to form a first photoresist segment and a second photoresist segment that are spaced from each other, wherein the first photoresist segment has two side areas having a thickness that is greater than a thickness of a central area;
   (4) using the first photoresist segment and the second photoresist segment as a shielding layer to subject the first metal layer, the ion induction layer, the poly-silicon layer to etching so as to form an island-like semiconductor and source/drain area;
   (5) subjecting the first photoresist segment and the second photoresist segment to ashing to remove the central area of the first photoresist segment, using a remaining portion of the first photoresist segment as a shielding layer to subject the first metal layer and the ion induction layer contained in the island-like semiconductor and source/drain area to etching to obtain an island-like semiconductor layer having a channel zone, source/drain contact zones located on the island-like semiconductor layer, and source/drain electrodes located on the source/drain contact zones; and peeling off remaining portions of the first photoresist segment and the second photoresist segment;
   (6) depositing a gate insulation layer on the source/drain electrodes; depositing a second metal layer on the gate insulation layer and subjecting the second metal layer to patterning to form a gate electrode;
   (7) forming a protection layer on the gate insulation layer and the gate electrode; forming a planarization layer on the protection layer; forming a via in the planarization layer, the protection layer, and the gate insulation layer to correspond to the source/drain electrodes; and
   (8) forming a cathode on the planarization layer such that the cathode is connected through the via to the source/drain electrodes; forming a pixel definition layer on the planarization layer and forming an opening in the pixel definition layer to expose a portion of the cathode; conducting vapor depositing of an organic light-emitting diode (OLED) in the opening.

2. The method for manufacturing a TFT substrate as claimed in claim 1, wherein in step (1), the base plate comprises a glass plate.

3. The method for manufacturing a TFT substrate as claimed in claim 1, wherein in step (1), the buffer layer comprises a silicon nitride layer, a silicon oxide layer, or a combination thereof; the buffer layer has a thickness of 2000-4000 Å.

4. The method for manufacturing a TFT substrate as claimed in claim 1, wherein in step (1), the amorphous silicon layer has a thickness of 2000-4000 Å.

5. The method for manufacturing a TFT substrate as claimed in claim 1, wherein in step (2), ions implanted into the amorphous silicon layer comprise boron ions or nickel ions.

6. The method for manufacturing a TFT substrate as claimed in claim 1, wherein in step (3), the first metal layer comprises one of molybdenum, aluminum, and copper, or a stacked combination of multiple ones thereof; the first metal layer has a thickness of 2000-4000 Å.

7. The method for manufacturing a TFT substrate as claimed in claim 1, wherein in step (6), the gate insulation layer comprises a silicon nitride layer, a silicon oxide layer, or a combination thereof; the gate insulation layer has a thickness of 2000-4000 Å.

8. The method for manufacturing a TFT substrate as claimed in claim 1, wherein in step (6), the second metal layer comprises one of molybdenum, aluminum, and copper, or a stacked combination of multiple ones thereof; the second metal layer has a thickness of 2000-4000 Å.

9. The method for manufacturing a TFT substrate as claimed in claim 1, wherein in step (7), the protection layer comprises a silicon nitride layer, a silicon oxide layer, or a combination thereof; the protection layer has a thickness of 2000-4000 Å.

10. The method for manufacturing a TFT substrate as claimed in claim 1, wherein in step (8), the cathode comprises a composition structure of indium tin oxide/silver/indium tin oxide or a single layer of metallic silver; the cathode has a thickness of 1000-3000 Å.

11. A method for manufacturing a thin-film transistor (TFT) substrate, comprising the following steps:

(1) providing a base plate, depositing a buffer layer on the base plate, and depositing an amorphous silicon layer on the buffer layer;

(2) subjecting the amorphous silicon layer to ion implantation and conducting high temperature baking to have the amorphous silicon crystallized and converted into poly-silicon to form a poly-silicon layer located on the buffer layer and an ion induction layer located on the poly-silicon layer;

(3) depositing a first metal layer on the ion induction layer, coating photoresist on the first metal layer, providing a half-tone mask and using the half-tone mask to subject the photoresist to exposure and development to form a first photoresist segment and a second photoresist segment that are spaced from each other, wherein the first photoresist segment has two side areas having a thickness that is greater than a thickness of a central area;

(4) using the first photoresist segment and the second photoresist segment as a shielding layer to subject the first metal layer, the ion induction layer, the poly-silicon layer to etching so as to form an island-like semiconductor and source/drain area;

(5) subjecting the first photoresist segment and the second photoresist segment to ashing to remove the central area of the first photoresist segment, using a remaining portion of the first photoresist segment as a shielding layer to subject the first metal layer and the ion induction layer contained in the island-like semiconductor and source/drain area to etching to obtain an island-like semiconductor layer having a channel zone, source/drain contact zones located on the island-like semiconductor layer, and source/drain electrodes located on the source/drain contact zones; and peeling off remaining portions of the first photoresist segment and the second photoresist segment;

(6) depositing a gate insulation layer on the source/drain electrodes; depositing a second metal layer on the gate insulation layer and subjecting the second metal layer to patterning to form a gate electrode;

(7) forming a protection layer on the gate insulation layer and the gate electrode; forming a planarization layer on the protection layer; forming a via in the planarization layer, the protection layer, and the gate insulation layer to correspond to the source/drain electrodes; and (8) forming a cathode on the planarization layer such that the cathode is connected through the via to the source/drain electrodes; forming a pixel definition layer on the planarization layer and forming an opening in the pixel definition layer to expose a portion of the cathode; conducting vapor depositing of an organic light-emitting diode (OLED) in the opening;

wherein in step (1), the base plate comprises a glass plate;

wherein in step (1), the buffer layer comprises a silicon nitride layer, a silicon oxide layer, or a combination thereof; the buffer layer has a thickness of 2000-4000 Å;

wherein in step (1), the amorphous silicon layer has a thickness of 2000-4000 Å;

wherein in step (2), ions implanted into the amorphous silicon layer comprise boron ions or nickel ions; and wherein in step (3), the first metal layer comprises one of molybdenum, aluminum, and copper, or a stacked combination of multiple ones thereof; the first metal layer has a thickness of 2000-4000 Å.

12. The method for manufacturing a TFT substrate as claimed in claim 11, wherein in step (6), the gate insulation layer comprises a silicon nitride layer, a silicon oxide layer, or a combination thereof; the gate insulation layer has a thickness of 2000-4000 Å.

13. The method for manufacturing a TFT substrate as claimed in claim 11, wherein in step (6), the second metal layer comprises one of molybdenum, aluminum, and copper, or a stacked combination of multiple ones thereof; the second metal layer has a thickness of 2000-4000 Å.

14. The method for manufacturing a TFT substrate as claimed in claim 11, wherein in step (7), the protection layer comprises a silicon nitride layer, a silicon oxide layer, or a combination thereof; the protection layer has a thickness of 2000-4000 Å.

15. The method for manufacturing a TFT substrate as claimed in claim 11, wherein in step (8), the cathode comprises a composition structure of indium tin oxide/silver/indium tin oxide or a single layer of metallic silver; the cathode has a thickness of 1000-3000 Å.

\* \* \* \* \*